United States Patent
Matsumoto

(10) Patent No.: US 7,460,610 B2
(45) Date of Patent: Dec. 2, 2008

(54) COMMUNICATION SYSTEM, RECEIVER, AND COMMUNICATION METHOD FOR CORRECTING TRANSMISSION COMMUNICATION ERRORS

(75) Inventor: Wataru Matsumoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 1017 days.

(21) Appl. No.: 10/491,670

(22) PCT Filed: May 22, 2003

(86) PCT No.: PCT/JP03/06396

§ 371 (c)(1),
(2), (4) Date: Apr. 5, 2004

(87) PCT Pub. No.: WO03/101034

PCT Pub. Date: Dec. 4, 2003

(65) Prior Publication Data

US 2004/0240481 A1    Dec. 2, 2004

(30) Foreign Application Priority Data

May 23, 2002 (JP) .............................. 2002-149174

(51) Int. Cl.
*H04B 15/00* (2006.01)

(52) U.S. Cl. .................... 375/285; 375/346; 714/758; 714/800; 714/775

(58) Field of Classification Search .............. 375/285, 375/226, 346; 714/758, 800, 775
See application file for complete search history.

(56) References Cited

U.S. PATENT DOCUMENTS

| 5,852,639 | A |   | 12/1998 | Murakami |
|---|---|---|---|---|
| 5,953,378 | A |   | 9/1999 | Hotani et al. |
| 6,982,937 | B2 | * | 1/2006 | Kanaoka et al. .......... 369/47.17 |
| 6,985,536 | B2 | * | 1/2006 | Oelcer et al. ................. 375/261 |
| 2003/0030930 | A1 | * | 2/2003 | Sugawara et al. ............. 360/48 |
| 2003/0037298 | A1 |   | 2/2003 | Eleftheriou et al. |
| 2003/0179813 | A1 |   | 9/2003 | Morita et al. |

FOREIGN PATENT DOCUMENTS

| JP | 8-125640 A | 5/1996 |
|---|---|---|
| JP | 10-150439 A | 6/1998 |
| JP | 2001-168733 A | 6/2001 |
| JP | 2002-314520 A | 10/2002 |
| JP | 2003-115768 A | 4/2003 |
| JP | 2003-198383 A | 7/2003 |

OTHER PUBLICATIONS

W. Oh et al., "Joint Decoding and Carrier Phase Recovery Algorithm for Turbo Codes," IEEE Communications Letters, vol. 5, No. 9, Sep. 2001, pp. 375-377.

(Continued)

*Primary Examiner*—Mohammad Ghayour
*Assistant Examiner*—Leila Malek
(74) *Attorney, Agent, or Firm*—Birch, Stewart, Kolasch & Birch, LLP

(57) ABSTRACT

A communication system includes a transmitter and a receiver. The transmitter transmits a signal encoded by a low-density parity-check (LDPC) coding. The receiver includes a decoder, a phase error estimator, and a correction unit. The decoder decodes the signal at a plurality of sampling points using a single iteration of sum-product decoding. The phase error estimator estimates a phase error of the signal using minimum mean square error (MMSE) estimation and soft decision information obtained by the sum-product decoding. The correction unit corrects the signal using the phase error.

17 Claims, 8 Drawing Sheets

OTHER PUBLICATIONS

W. Matsumoto et al., "Blind Synchronization with Enhanced Sum-Product Algorithm for Low-Density Parity-Check Codes," Wireless Personal Multimedia Communications, 2002, The 5th International Symposium on Oct. 27-30, 2002, vol. 3, pp. 966-970.

R. G. Gallager, "Low-Density Parity-Check Codes," IRE Transactions on Information Theory, IEEE Inc., New York, Jan. 1962, pp. 21-28.

* cited by examiner

| MODULATION | BPSK |
| --- | --- |
| INFORMATION LENGTH | 3071 |
| RATE | 0.5 |
| CHANNEL | AWGN |
| CHANNEL CODING | LDPC CODE |
| CHANNEL MODEL | AWGN |

FIG.4

| RATE | 0.5 |
|---|---|
| CODEWORD LENGTH | 6140 |

| | x | $\lambda_x$ | No. |
|---|---|---|---|
| | 2 | 0.165506 | 2709 |
| | 3 | 0.187867 | 2050 |
| | 6 | 0.007331 | 40 |
| | 8 | 0.223851 | 916 |
| | 32 | 0.415445 | 425 |

| | x | $\rho_x$ | No. |
|---|---|---|---|
| | 10 | 0.3125 | 1023 |
| | 11 | 0.6875 | 2046 |
| $\sigma_{GA}$ | 0.959309 | | |
| $SNR_{norm}$ (GA) | 0.1719 | | |

COMMUNICATION SYSTEM, RECEIVER, AND COMMUNICATION METHOD FOR CORRECTING TRANSMISSION COMMUNICATION ERRORS

TECHNICAL FIELD

The present invention relates to a communication system capable of performing synchronous control without using specific symbols such as a preamble and a user code, and, more particularly, to a communication system, a receiver, and a communication method which can perform synchronous control using an LDPC (Low-Density Parity-Check)-encoded signal.

BACKGROUND ART

Conventional synchronous control will be explained below. First, a conventional synchronism establishing method will be explained. For example, the transmission side sends N phase-inverted signals (preambles) (see the top and the middle in FIG. 12). The reception side, on the other hand, detects inversion of the phase in a preamble, outputs a sync signal at this timing (see the bottom in FIG. 12), and demodulates data of a waveform to be modulated. Normally, to ensure accurate synchronism even in a channel with a lot of noise, the number N is often set equal to or more than 10.

The conventional user detection method will be explained next. Normally, the reception side checks if a received frame is a communication frame directed to the own device by using a user code to be transmitted following the preamble (see FIG. 13). At this time, the reception side performs user detection depending on whether it matches with a unique code assigned to the own device. In general, to reduce the probability that code patterns coincide with each other by accident due to noise or the like, at least one byte (8 bits) is often allocated to the user code. As the structure of the communication frame, for example, various control codes are located before and after the user code, and data (payload data) for a user are located following them (see FIG. 13).

However, according to the above conventional communication method, synchronous control is carried out by arranging preambles and a user code in a communication frame. Therefore, there is a problem that the communication frame becomes redundant.

DISCLOSURE OF THE INVENTION

It is an object of the present invention to at least solve the problems in the conventional technology.

A communication system according to one aspect of the present invention includes a transmitter that transmits a signal encoded by a low-density parity-check (LDPC) coding and a receiver that includes a decoder, a phase error estimator, and a correction unit. The decoder decodes the signal at a plurality of sampling points using a single iteration of sum-product decoding. The phase error estimator estimates a phase error of the signal using minimum mean square error (MMSE) estimation and soft decision information obtained by the sum-product decoding. The correction unit corrects the signal using the phase error.

A receiver according to another aspect of the present invention includes a decoder that decodes a low-density parity-check (LDPC) encoded signal at a plurality of sampling points using a single iteration of sum-product decoding; a phase error estimator that estimates a phase error of the signal using minimum mean square error (MMSE) estimation and soft decision information obtained by the sum-product decoding; and a correction unit that corrects the signal using the phase error.

A communication method according to still another aspect of the present invention includes decoding a low-density parity-check (LDPC) encoded signal at a plurality of sampling points using a single iteration of sum-product decoding; estimating a phase error of the signal using minimum mean square error (MMSE) estimation and soft decision information obtained by sum-product decoding; and correcting the signal using the phase error.

The other objects, features, and advantages of the present invention are specifically set forth in or will become apparent from the following detailed descriptions of the invention when read in conjunction with the accompanying drawings.

BRIEF DESCRIPTION OF THE DRAWINGS

FIG. 4 illustrates parameters concerning communications between communication apparatuses;

BEST MODE FOR CARRYING OUT THE INVENTION

Embodiments of a communication system, a receiver, and a communication method according to the present invention will be described in detail below based on the drawings. However, it is to be noted that the invention is not limited by the embodiments.

Figure 1A:
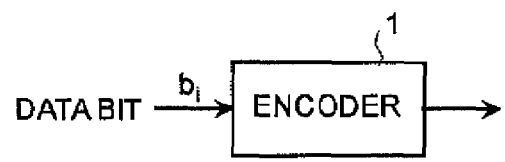
FIGS. 1A and 1B illustrate a configuration of a communication system according to the present invention.
Figure 1B:
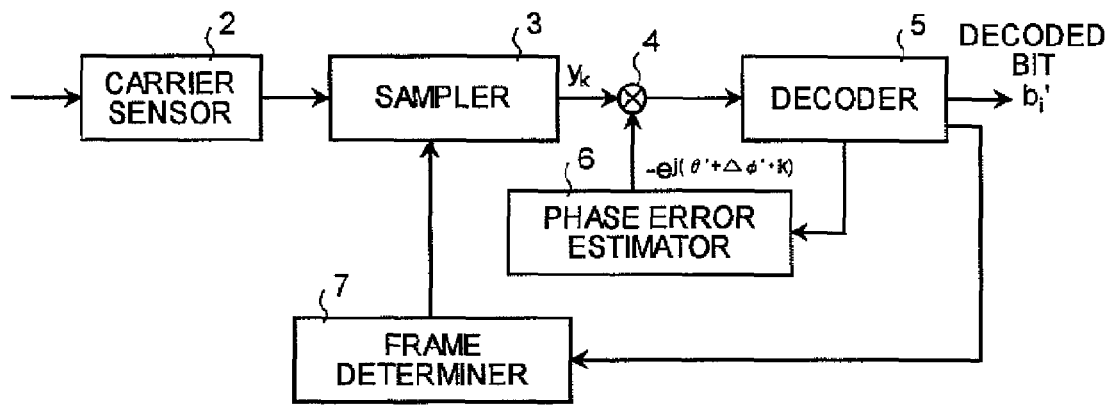

FIGS. 1A and 1B illustrate a communication system according to the present invention. Specifically, FIG. 1A illustrates a configuration of a communication apparatus at a transmission side (transmitter), and FIG. 1B illustrates a configuration of a communication apparatus at a receiver side (receiver). In FIGS. 1A and 1B, 1 denotes an encoder, 2 denotes a carrier sensor, 3 denotes a sampler, 4 denotes a multiplier, 5 denotes a decoder, 6 denotes a phase error estimator, and 7 denotes a frame determiner.

Each communication apparatus in the above communication system employs an LDPC code as an error detection code. In an LDPC coding/decoding processing, an Additive White Gaussian Noise (AWGN) communication channel is assumed.

For example, when a Quadrature Phase Shift Keying (QPSK) modulation is used at a coding rate 0.5, a reception signal $y_k$ in the communication apparatus at the reception side can be expressed by the following expression (1).

$$y_k = c_k + n_k = r_{2k-1} + j \quad (1)$$

The reception signal $y_k$ is a complex reception signal at a sampling point k, where k=1, 2, ..., $L_c/2$, $L_c$ denotes a code length, $c_k$ denotes a coding series of the QPSK, and $n_k$ denotes $2\sigma_0^2$ complex additive white Gaussian noise. The sampling point k of the complex reception signal includes (two) sampling points of a real axis and an imaginary axis, and Ts denotes an interval between sampling points on a time axis. In other words, sampling points of the real axis and the imaginary axis are generated at the interval of Ts on a time axis.

The coding series $c_k$ of the QPSK is given by the following expression (2), where reception signals corresponding to $u_{2k-1}$ and $U_{2k}$ are expressed as $r_{2k-1}$ and $r_{2k}$ respectively.

$$c_k = u_{2k-1} + j \cdot u_{2k} \quad (2)$$

The reception signal $y_k$ can be modeled as given by the following expression (3), where θ denotes a timing offset, and Δϕ denotes a carrier wave frequency offset.

$$y_k = e^{j(\theta + \Delta\phi \cdot k)} c_k + n_k \quad (3)$$

Prior to explanation of a frame synchronous control and decoding processing according to the present embodiment, a basic operation of a frame synchronous control using LDPC codes will be explained. An LDPC-encoded signal is decoded using a common decoding method of "sum-product algorithm". Then, a frame synchronous control is carried out using an average value of absolute values of the LLR (logarithmic likelihood ratio) as an output of the "sum-product algorithm". It is assumed that a frame length is equal to a code word length. The receiver (communication apparatus at the reception side) has a function capable of detecting carrier power (carrier sense). A rough starting point of a reception frame is estimated using this carrier sense function.

The transmitter (communication apparatus at the transmission side) encodes binary data using an LDPC encoder to generate code words $b_i$ (i=1, 2, ..., and Lc). It is assumed that the code words are mapped beforehand at signal asterism points. The real axis is $u_{2k-1}\{+1,-1\}$, and the imaginary axis is $u_{2k}\{+1,-1\}$.

The processing concerning transmission and reception is applied to a block of a data bit $b_i \in \{1,0\}$ having a length $L_D$. Therefore, when the coding rate is R ($0 \leq R \leq 1$), the code length $L_c$ becomes $L_c = L_D/R$.

The receiver carries out the carrier sense, and then analyzes continuous ±M sampling points, that is, executes the "sum-product algorithm" at the continuous ±M sampling points, thereby to set the frame synchronization. In the "sum-product algorithm", a probability $Pr\{u_k=+1|r\}$ and a probability $Pr\{u_k=-1|r\}$ obtained from blocks $r=[r_1, r_2, ..., and\ r_{LC}]$ of the reception symbol are calculated. Specifically, a pseudo-posteriori LLR (logarithmic likelihood ratio) according to a first repetition decoding is calculated as shown in the following expression (4).

$$L_u^1(u_i) \equiv \ln \frac{Pr\{u_i = +1 | r\}}{Pr\{u_i = -1 | r\}} \quad (4)$$

Figures 2, 3:
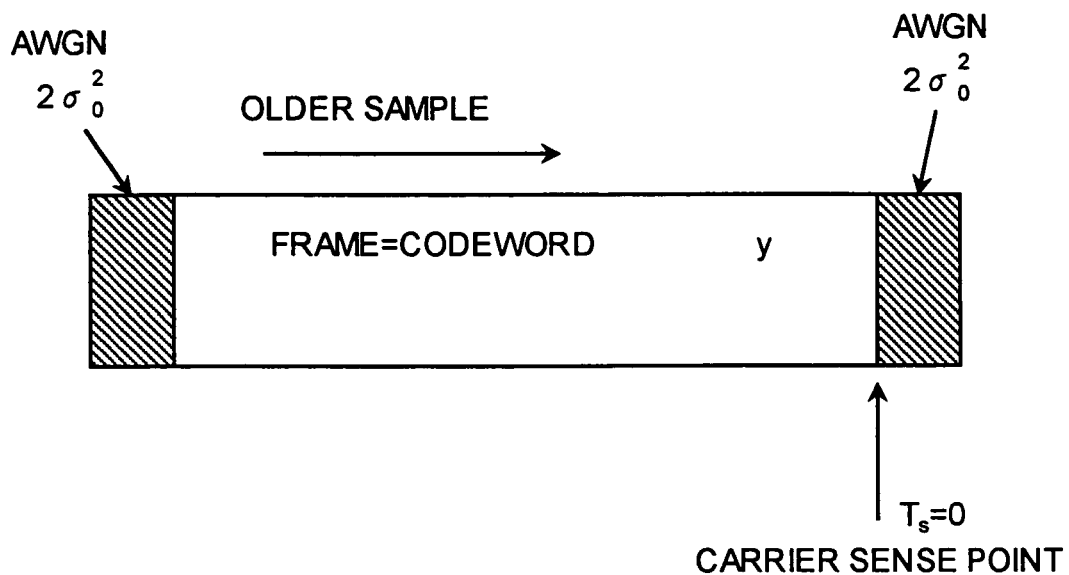
FIG. 2 illustrates a frame structure.
FIG. 3 illustrates parameters concerning communications between communication apparatuses.

Then, following an expression (5), a maximum value is detected from among average values of absolute values of the LLR at the ±M sampling points, and a point corresponding to this maximum value is set as a sample starting point g' of the frame. FIG. 2 illustrates a frame structure.

$$g' = \arg \max_{g \in [-M, M]} \frac{1}{L_c} \sum_{s=g}^{g+L_c-1} |L_u(u_s)| \quad (5)$$

Frame synchronization is set based on the above expressions (4) and (5). Thereafter, the receiver continues a decoding processing according to the "sum-product algorithm".

Next, whether frame synchronization can be set is verified using "Irregular-LDPC code" of the coding rate (Rate)=0.5. FIG. 3 and FIG. 4 illustrate parameters concerning communications between the communication apparatuses. FIG. 4 illustrates one example of ensemble (weight distribution) of the "Irregular-LDPC code", where $\lambda_x$ denotes a ratio of a total weight included in a column of a weight x, to a total weight of a check matrix, $p_x$ denotes a ratio of a total weight included in a row of the weight x, to the total weight of the check matrix, and No. denotes a number of columns or rows of the weight x. $\sigma_{GA}$ denotes an estimate threshold value of communication channel noise using a standard deviation according to the Gaussian approximation method. $SNR_{norm}(GA)$ denotes a difference from a shannon limit in decibel. The shannon limit is σ=0.97869 at the coding rate=0.5.

Figure 5:
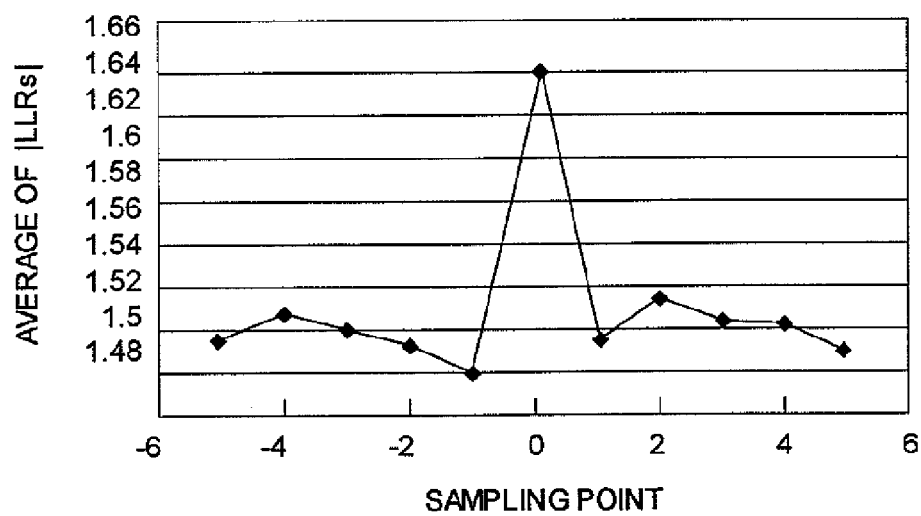
FIG. 5 illustrates an average value of absolute values of an LLR at each sampling point.

FIG. 5 illustrates an average value of absolute values of the LLR at each sampling point. The receiver detects the maximum point from among the average values of the absolute values of the LLR, thereby to accurately set frame synchronization.

Figure 6:
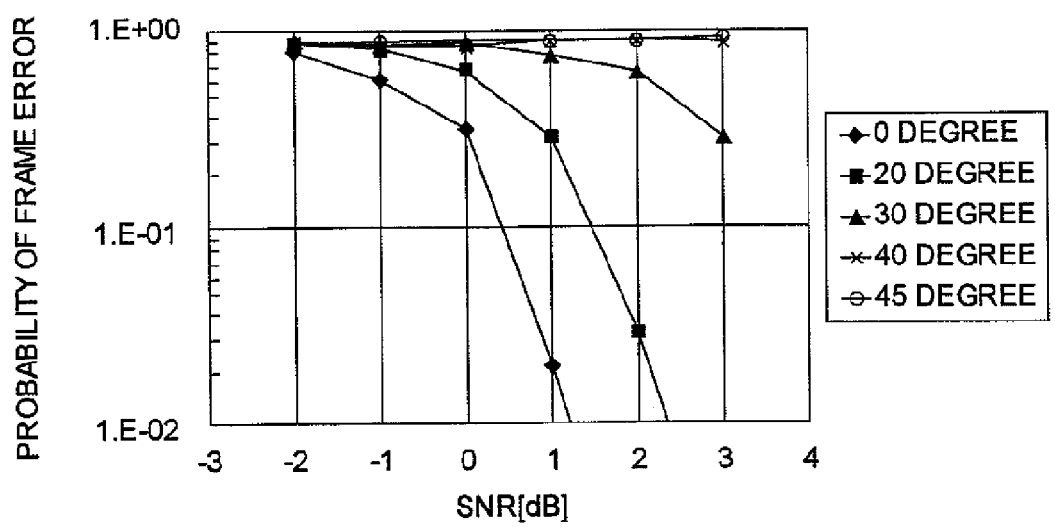
FIG. 6 illustrates a probability of a frame error.

In order to estimate degradation of performance generated due to inappropriate sampling points, the frame synchronization is evaluated in a state of different timing offsets. FIG. 6 illustrates a probability of a frame error at different timing offsets from 0 degrees to 45 degrees. As a result, it is clear that when the timing offset exceeds 30 degrees, the receiver that carries out the above frame synchronous control has difficulty in recovering the frame synchronization. In other words, it is clear that when the timing offset exceeds 30 degrees, frame error characteristics are degraded.

The basic operation of the frame synchronous control using the LDPC codes is explained above. The operation of the receiver according to the present embodiment that carries out the frame synchronous control and the decoding processing while correcting the timing offset and the frequency offset will be explained in detail below with reference to FIGS. 1A and 1B. The transmitter (corresponding to the encoder 1) operates in a similar manner to that described above, and therefore, explanation of this operation will be omitted.

Specifically, in the present embodiment, the timing offset and the frequency offset are estimated using a soft decision bit that is input according to the "sum-product algorithm", in a state that the sampling timing and the carrier wave frequency are not synchronized. In this case, the receiver executes an extended "sum-product algorithm" using the MMSE method. The extended "sum-product algorithm" consists of an MMSE phase error estimate/correction process, a frame synchronous process, and a normal "sum-product algorithm" process.

(A) The MMSE Phase Error Estimate/Correction Process

First, the decoder 5 calculates an initial LLR message of the reception signal following the expression (6). In this case, a repetition counter is set to I=1 and a maximum repetition number is set to $I_{max}$ in the decoder 5 respectively.

$$L_u^0(u_i) \equiv \ln\frac{Pr\{u_i = +1 \mid r\}}{Pr\{u_i = -1 \mid r\}} \quad (6)$$

$$= \frac{1/\sqrt{2\pi\sigma_0^2}\exp(-(r_i-1)^2/2\sigma_0^2)}{1/\sqrt{2\pi\sigma_0^2}\exp(-(r_i+1)^2/2\sigma_0^2)}$$

$$= \frac{2r_i}{\sigma_0^2}$$

The "sum-product algorithm" is executed only once, using a parity check matrix H (iteration 1).

Next, the decoder 5 estimates s soft decision bit $u_k'$ using the following expression (7), using a quasi-LLR of a coding signal $\{u_k\}^{L_c}$ (where k=1) after repeating once. E{·} denotes an average value.

$$u_k' \equiv E\{u_k\} \quad (7)$$

$$= Pr\{u_k = +1\}\cdot 1 + Pr\{u_k = -1\}\cdot(-1)$$

$$= \ln\frac{\exp(L_u^1(u_k))}{1+\exp(L_u^1(u_k))} + \frac{-1}{1+\exp(L_u^1(u_k))}$$

$$= \tanh\left(\frac{L_u^1(u_k)}{2}\right)$$

Next, the phase error estimator 6 estimates the phase error $(\theta',\Delta\phi')$ following the MSE, that is, using the following expression (8) and expression (9).

$$\theta' + \Delta\phi'\cdot k = \arg\min E\left\{\left|\tan^{-1}\frac{\text{Im}[y_k/c_k']}{\text{Re}[y_k/c_k']} - (\theta'+\Delta\phi\cdot k)\right|^2\right\} \quad (8)$$

$$E_p' = \frac{1}{L_c/2}\sum_{k=1}^{L_c/2}\tan^{-1}\frac{\text{Im}[y_k/c_k']}{\text{Re}[y_k/c_k']} \quad (9)$$

$$\text{where } E_p(k) = \tan^{-1}\frac{\text{Im}[y_k/c_k']}{\text{Re}[y_k/c_k']}$$

$$k' = \frac{1}{L_c/2}\sum_{k=1}^{L_c/2}k$$

$$\Delta\phi = \frac{\sum k\cdot E_p(k) - (L_c/2)\cdot E_p'\cdot k'}{\sum k^2 - (L_c/2)\cdot(k')^2}$$

$$\theta' = \frac{E_p\cdot\sum k^2 - k'\sum k\cdot E_p(k)}{\sum k^2 - (L_c/2)\cdot(k')^2}$$

Figure 7:
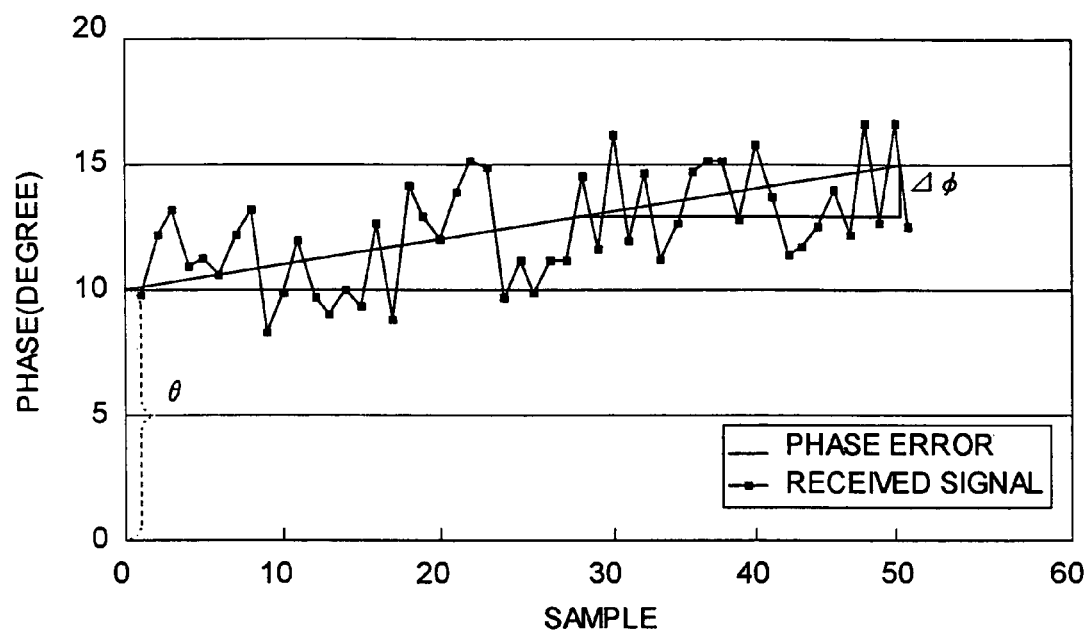
FIG. 7 illustrates a regression line of $\theta'+\Delta\phi'$.

$c_k'=u_{2k-1}'+ju_{2k}'$, Im denotes an imaginary axis, Re denotes a real axis, $\theta'$ denotes an estimate sample error (timing offset), $\Delta\phi'$ denotes an estimate flock error (frequency offset), and $\theta'+\Delta\phi'$ is regarded as a primary regression straight line. FIG. 7 illustrates a regression straight line of $\theta'+\Delta\phi'$. Ep' denotes an average of soft decision phase errors.

Next, the multiplier 4 corrects the soft decision phase errors (timing offset, frequency offset) of the reception signal. In other words, the phase error obtained above is multiplied to the reception signal $y_k$, and the correction value $y_k'$ of the reception signal is obtained as shown in an expression (10). As a result, a reception signal after the correction is obtained as shown in an expression (11).

$$y_k' = y_k\cdot e^{-j(\theta'+\Delta\phi'\cdot k)} \quad (10)$$

$$= (r_{2k-1} + j\cdot r_{2k})\cdot(\cos(\theta'+\Delta\phi\cdot k) - j\cdot\sin(\theta'+\Delta\phi\cdot k))$$

$$r'_{2k-1} = \text{Re}\{(r_{2k-1}+j\cdot r_{2k})\cdot(\cos(\theta'+\Delta\phi'\cdot k)-k\sin(\theta'+\Delta\phi'\cdot k))\}$$

$$r'_{2k} = \text{Im}\{(r_{2k-1}+j\cdot r_{2k})\cdot(\cos(\theta'+\Delta\phi'\cdot k)-j\sin(\theta'+\Delta\phi'\cdot k))\} \quad (11)$$

Next, the decoder 5 updates the LLR using the corrected reception signal. An LLR message updated by the correction is given by the following expression (12).

$$L_u^0(u_i) \equiv \ln\frac{Pr\{u_i = +1 \mid r'\}}{Pr\{u_i = -1 \mid r'\}} = \frac{2r_i'}{\sigma_0^2} \quad (12)$$

Next, the frame determiner 7 decides whether the phase error correction processing is finished, by comparing an average value $m^I$ of the latest LLR with an average value $m^{I-1}$ of an LLR one before. For example, when the frame determiner 7 decides that $m^{I-1}<m^I$, the decoder 5, the phase error estimator 6, and the multiplier 4 execute the processing of the "sum-product algorithm" and after. The average value m of the LLR is given by the following expression (13).

$$m_u^1 = \frac{1}{L_c}\sum_{i=1}^{L_c}|L_u^1(u_i)| \quad (13)$$

(B) The Frame Synchronous Process

When the frame determiner 7 decides that $m^{I-1}\geq m^I$, the decoder 5 executes the following expression (14), and carries out the frame synchronous control. Specifically, the decoder 5 detects a maximum value of the average values of absolute values of the LLR corresponding to candidates of $\pm M$ sampling points, that is, 2M+1 sample starting points, and sets a point corresponding to the maximum value as a sample starting point g'. The processing up to this point becomes the "iteration=1" processing. The candidates of the 2M+1 sample starting points are determined based on the information from the carrier sensor 2 that can detect carrier power. Based on this carrier sense function, a rough starting position of the reception frame (candidate of sample starting point) can be estimated.

$$g' = \arg\max_{g\in[-M,M]}\frac{1}{L_c}\sum_{s=g}^{g+L_c-1}|L_u^1(u_s)| \quad (14)$$

(C) The Normal "Sum-Product Algorithm" Process

Thereafter, the decoder 5 executes a common "sum-product algorithm" to the frame selected in the processing (B). In other words, when common hard decision bits $(b_1',b_2',\ldots,b_{Lc}')$ satisfy $(b_1',b_2',\ldots,b_{Lc}')\times H=0$, the decoder 5 outputs the hard decision bits and stops the "sum-product algorithm". On the other hand, when $(b_1',b_2',\ldots,b_{Lc}')\times H=0$ is not satisfied and also when $I\leq I_{max}$, the decoder 5 increments the counter value 1 inside the decoder 5, and continues the decoding until when $I=I_{max}$.

The basic operation of the frame synchronous control using the LDPC codes and the operation of the receiver according to the present embodiment that executes the frame synchronous control and the decoding processing while correcting the timing offset and the frequency offset are explained above. Decoding characteristics of the receiver according to the present embodiment will be analyzed below.

Figure 8:
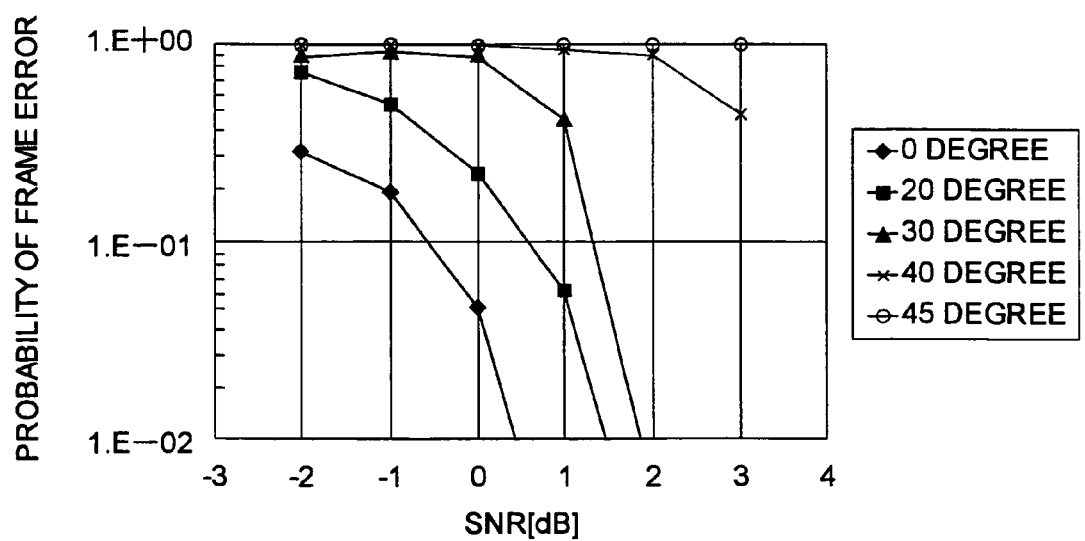
FIG. 8 illustrates a probability of a frame error.

FIG. 8 illustrates a probability of a frame error due to different timing offsets from 0 degree to 45 degrees when the receiver according to the present embodiment is used (when the phase error correction is carried out following the MMSE). As explained above, in the decoding method according to the present embodiment, accurate frame detection can be achieved at the SNR of about 2 decibels even when the timing offset extends to 30 degrees.

Figure 9:
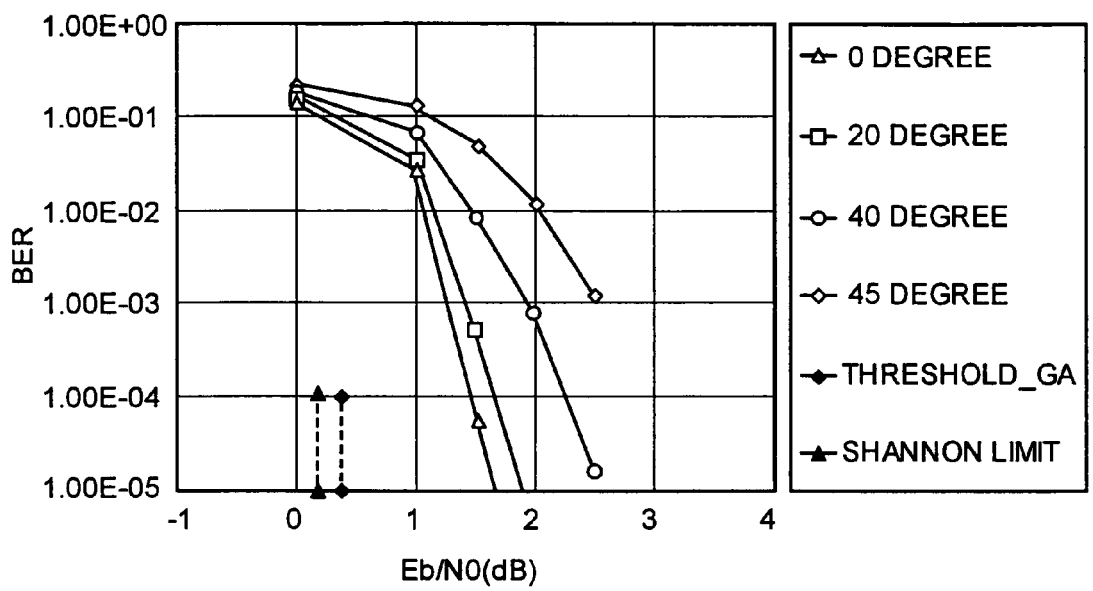
FIG. 9 illustrates BER characteristics.

FIG. 9 illustrates BER characteristics. In the drawing, "0 degree", "20 degrees", "40 degrees", and "45 degrees" denote timing offset values. The frequency offset is uniformly set to −0.0036 degrees (−10 parts per million). For example, when the number of repetition is 100 times at Δφ: −0.0036 degrees (−10 ppm) and also when the timing offset value is "20 degrees" at BER=$10^{-4}$ points, the BER characteristics are degraded by only about 0.3 decibels as compared with when the timing offset value is "0 degree". Further, when the timing offset value is "40 degrees", the BER characteristics are degraded by only about 0.8 decibels as compared with when the timing offset value is "0 degree".

Figure 10:
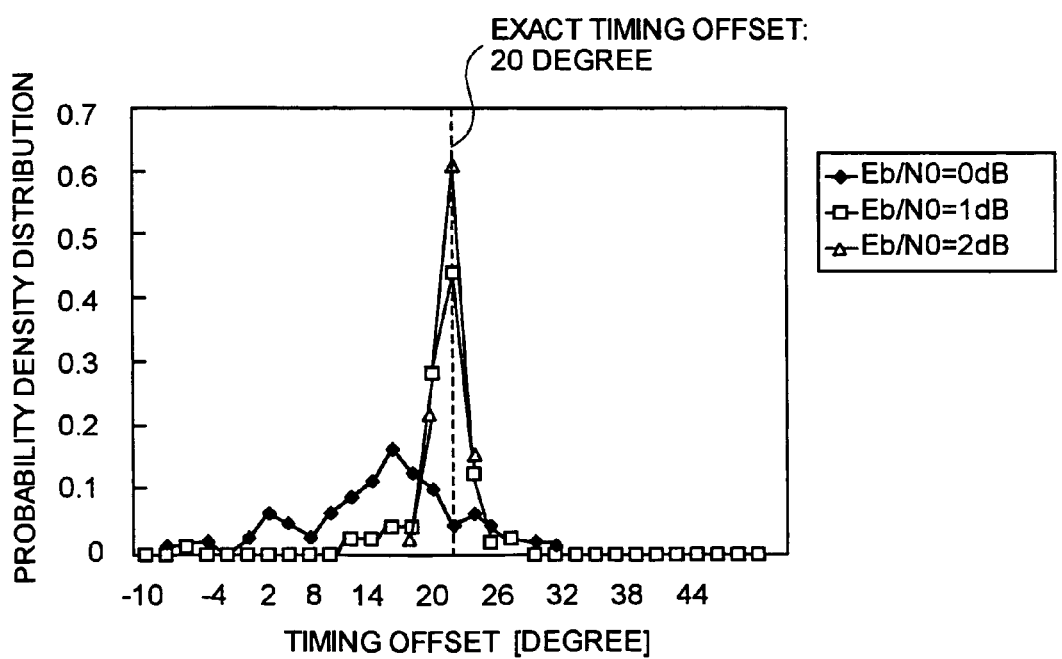
FIG. 10 illustrates a probability density distribution of an estimate value of timing offset.
Figure 11:
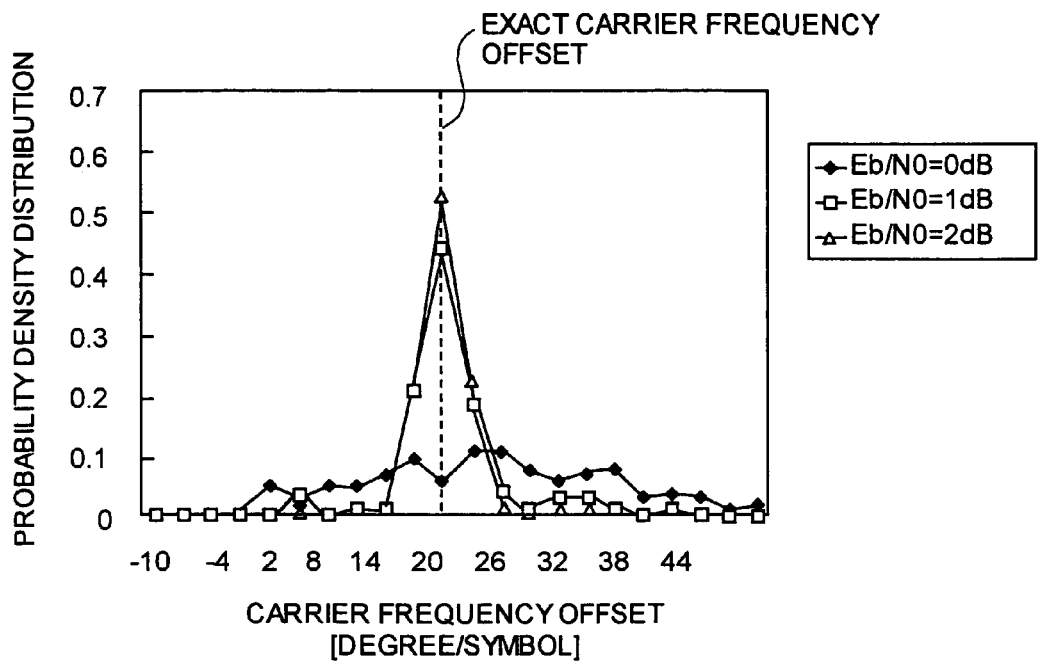
FIG. 11 illustrates a probability density distribution of an estimate value of frequency offset.
Figure 12:
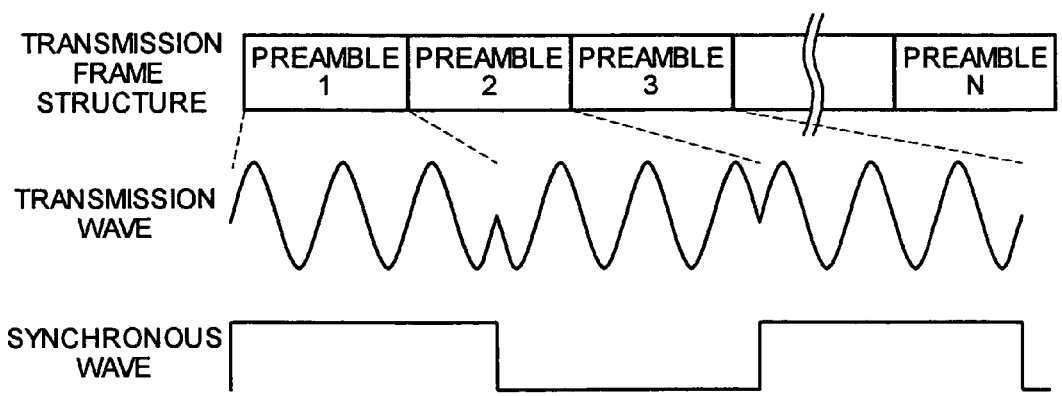
FIG. 12 illustrates a conventional synchronous control method.
Figure 13:
FIG. 13 explains about a conventional user detection method.

FIG. 10 illustrates a probability density distribution of an estimate value of timing offset, and FIG. 11 illustrates a probability density distribution of an estimate value of frequency offset. From these drawings, it is clear that the accuracy levels of the timing offset estimate value and the frequency offset estimate value increase when $E_b/N_0$ increases by exceeding the estimate threshold value according to the Gaussian approximation method.

As explained above, in the present embodiment, the common decoding processing ("sum-product algorithm") has a soft decision phase error correction function according to the MMSE. In other words, the frame synchronous control and the decoding processing is executed while correcting the timing offset and the frequency offset, without using the PLL. With this arrangement, for example, in the QPSK modulation, satisfactory characteristics (decoding performance) can be obtained even when the timing offset near 40 degrees occurs.

As explained above, according to one aspect of the present invention, the common decoding processing ("sum-product algorithm") has a soft decision phase error correction function according to the MMSE. With this arrangement, there is an effect that even when the timing offset near 40 degrees occurs, for example, satisfactory characteristics (decoding performance) can be obtained.

According to another aspect of the present invention, in the frame structure including no preambles or user codes, the frame synchronous control and the decoding processing is executed while correcting the timing offset and the frequency offset, without using the PLL. With this arrangement, there is an effect that it is possible to obtain a communication system capable of preventing wasteful redundancy of frames and capable of detecting accurate frame positions.

According to still another aspect of the present invention, candidates of the 2M+1 sample starting points are determined using the carrier sense function. Based on this carrier sense function, there is an effect that it is, possible to obtain a communication system capable of effectively estimating a rough starting position of the reception frame (candidate of sample starting point).

According to still another aspect of the present invention, the common decoding processing ("sum-product algorithm") has a soft decision phase error correction function according to the MMSE. With this arrangement, there is an effect that even when the timing offset near 40 degrees occurs, for example, satisfactory characteristics (decoding performance) can be obtained.

According to still another aspect of the present invention, in the frame structure including no preambles or user codes, the frame synchronous control and the decoding processing is executed while correcting the timing offset and the frequency offset, without using the PLL. With this arrangement, there is an effect that it is possible to obtain a communication system capable of preventing wasteful redundancy of frames and capable of detecting accurate frame positions.

According to still another aspect of the present invention, candidates of the 2M+1 sample starting points are determined using the carrier sense function. Based on this carrier sense function, there is an effect that it is possible to obtain a communication system capable of effectively estimating a rough starting position of the reception frame (candidate of sample starting point).

According to still another aspect of the present invention, the common decoding processing ("sum-product algorithm") has a soft decision phase error correction function according to the MMSE. With this arrangement, for example, in the QPSK modulation, satisfactory characteristics (decoding performance) can be obtained even when the timing offset near 40 degrees occurs.

According to still another aspect of the present invention, in the frame structure including no preambles or user codes, the frame synchronous control and the decoding processing is executed while correcting the timing offset and the frequency offset, without using the PLL. With this arrangement, there is an effect that it is possible to obtain a communication system capable of preventing wasteful redundancy of frames and capable of detecting accurate frame positions.

According to still another aspect of the present invention, candidates of the 2M+1 sample starting points are determined using the carrier sense function. Based on this carrier sense function, there is an effect that it is possible to effectively estimate a rough starting position of the reception frame (candidate of sample starting point).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

As explained above, the communication system, the receiver, and the communication method according to the present invention are useful for a system that executes a synchronous control without using specific symbols such as preambles or user codes. Particularly, the invention is useful for a communication system that executes a synchronous control using an LDPC-encoded signal.

The invention claimed is:

1. A communication system comprising:
    a transmitter that transmits a signal encoded by a low-density parity-check (LDPC) coding; and
    a receiver that includes
        a decoder that decodes the signal at a plurality of sampling points using a single iteration of sum-product decoding;
        a phase error estimator that estimates a phase error of the signal using minimum mean square error (MMSE)

estimation and soft decision information obtained by the sum-product decoding; and a correction unit that corrects the signal using the phase error.

2. The communication system according to claim 1, wherein the phase error is at least one of a timing offset and a frequency offset.

3. The communication system according to claim 1, wherein the receiver includes a carrier sensor that detects carrier power of the signal, and the sampling points is determined based on the carrier power.

4. The communication system according to claim 1, wherein the receiver includes a frame synchronous controller that obtains averages of absolute values of logarithmic likelihood ratios by the sum-product decoding, selects a maximum value out of the averages corresponding to the sampling points, and determines a communication frame by setting a sampling point corresponding to the maximum value as a sample starting point, wherein the decoder repeatedly decodes the communication frame using sum-product decoding until one of when iteration number reaches a predetermined number and when there is no error.

5. The communication system according to claim 4, wherein the frame synchronous controller controls the decoder, the phase error estimator, and the correction unit, depending on the averages.

6. The communication system according to claim 5, wherein the frame synchronous controller compares a first average with a second average, out of the averages, the first average being an average of absolute values of latest logarithmic likelihood ratios, the second average being an average of absolute values of logarithmic likelihood ratios just before the latest logarithmic likelihood ratios, operates the decoder, the phase error estimator, and the correction unit again using the signal corrected when the first average is greater than the second average, and stops the decoder, the phase error estimator, and the correction unit when the first average is equal to or less than the second average.

7. A receiver comprising:

a decoder that decodes a low-density parity-check (LDPC) encoded signal at a plurality of sampling points using a single iteration of sum-product decoding;

a phase error estimator that estimates a phase error of the signal using minimum mean square error (MMSE) estimation and soft decision information obtained by the sum-product decoding; and a correction unit that corrects the signal using the phase error.

8. The receiver according to claim 7, wherein the phase error is at least one of a timing offset and a frequency offset.

9. The receiver according to claim 7, further comprising a carrier sensor that detects carrier power of the signal, wherein the sampling points is determined based on the carrier power.

10. The receiver according to claim 7, further comprising a frame synchronous controller that obtains averages of absolute values of logarithmic likelihood ratios by the sum-product decoding, selects a maximum value out of the averages corresponding to the sampling points, and determines a communication frame by setting a sampling point corresponding to the maximum value as a sample starting point, wherein the decoder repeatedly decodes the communication frame using sum-product decoding until one of when iteration number reaches a predetermined number and when there is no error.

11. The receiver according to claim 10, wherein the frame synchronous controller controls the decoder, the phase error estimator, and the correction unit, depending on the averages.

12. The receiver according to claim 11, wherein the frame synchronous controller compares a first average with a second average, out of the averages, the first average being an average of absolute values of latest logarithmic likelihood ratios, the second average being an average of absolute values of logarithmic likelihood ratios just before the latest logarithmic likelihood ratios, and operates the decoder, the phase error estimator, and the correction unit again using the signal corrected when the first average is greater than the second average, and stops the decoder, the phase error estimator, and the correction unit when the first average is equal to or less than the second average.

13. A communication method comprising:

decoding a low-density parity-check (LDPC) encoded signal at a plurality of sampling points using a single iteration of sum-product decoding;

estimating a phase error of the signal using minimum mean square error (MMSE) estimation and soft decision information obtained by sum-product decoding; and correcting the signal using the phase error.

14. The communication method according to claim 13, wherein the phase error is at least one of a timing offset and a frequency offset.

15. The communication method according to claim 13, further comprising:

detecting carrier power of the signal, and determining the sampling points based on the carrier power.

16. The communication method according to claim 13, further comprising:

obtaining averages of absolute values of logarithmic likelihood ratios by sum-product decoding;

selecting a maximum value out of the averages corresponding to the sampling points; and determining a communication frame by setting a sampling point corresponding to the maximum value as a sample starting point, wherein the decoding includes repeatedly decoding the communication frame using sum-product decoding until one of when iteration number reaches a predetermined number and when there is no error.

17. The communication method according to claim 16, further comprising:

comparing a first average with a second average, out of the averages, the first average being an average of absolute values of latest logarithmic likelihood ratios, the second average being an average of absolute values of logarithmic likelihood ratios just before the latest logarithmic likelihood ratios;

performing the decoding, the estimating, and the correcting again using the signal corrected when the first average is greater than the second average; and finishing the decoding, the estimating, and the correcting when the first average is equal to or less than the second average.

* * * * *